United States Patent
Chang et al.

(10) Patent No.: US 6,803,329 B2
(45) Date of Patent: Oct. 12, 2004

(54) METHOD FOR LOW TEMPERATURE LIQUID-PHASE DEPOSITION AND METHOD FOR CLEANING LIQUID-PHASE DEPOSITION APPARATUS

(75) Inventors: Edward Y. Chang, Hsinchu (TW);
Muh-Wang Liang, MiaoLi (TW);
Shih-Ming Chiang, Hsinchu (TW);
Chih-Yuan Tseng, Hsinchu (TW);
Pang-Min Chiang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 28 days.

(21) Appl. No.: 10/342,245

(22) Filed: Jan. 15, 2003

(65) Prior Publication Data

US 2004/0137753 A1 Jul. 15, 2004

(51) Int. Cl.[7] ................................................ H01L 21/31
(52) U.S. Cl. .......................... 438/782; 438/778; 117/69
(58) Field of Search .................................. 438/778, 782, 438/787, 758, 779, 762, 14; 427/169, 165; 117/68, 69

(56) References Cited

U.S. PATENT DOCUMENTS 5,998,304 A * 12/1999 Houng et al. ................ 438/758
6,613,697 B1 * 9/2003 Faur et al. ................... 438/770

* cited by examiner

Primary Examiner—Jack Chen
Assistant Examiner—Thanhha Pham
(74) Attorney, Agent, or Firm—Troxell Law Office PLLC

(57) ABSTRACT

A method for low temperature liquid-phase deposition and a method for cleaning a liquid-phase deposition apparatus are disclosed. The method for low temperature liquid-phase deposition is employed so as to form a low-temperature grown film or a film with excellent step-coverage on the surface of a semiconductor device having independent circuit functions. The method for cleaning liquid-phase deposition apparatus is characterized in that a loop used exclusively for cleaning is employed so as to prevent $SiO_2$ powders from remaining in the loop.

6 Claims, 5 Drawing Sheets

METHOD FOR LOW TEMPERATURE LIQUID-PHASE DEPOSITION AND METHOD FOR CLEANING LIQUID-PHASE DEPOSITION APPARATUS

BACKGROUND OF THE INVENTION

1. Field of the Invention

The present invention generally relates to a method for low temperature liquid-phase deposition for forming a low-temperature grown film or a film with excellent step-coverage as a passivation layer on the surface of a semiconductor device having independent circuit functions, and to a method for cleaning a liquid-phase deposition apparatus, in which a loop used exclusively for cleaning is employed so as to prevent $SiO_2$ powders from remaining in the loop.

2. Description of the Prior Art

In recent years, low temperature deposition has become one of the most important techniques for semiconductor device manufacturing in order to avoid degradation of the device characteristics due to the thermal stress on the thin films.

For the most important insulator material used in IC technology, silicon oxide, different deposition conditions results in different characteristics and applications of the thin film. In early days, silicon oxide was grown in the furnace in the temperature range from 700 to 1000° C. However, such a temperature range may cause mal-functions of the semiconductor device formed on the substrate because the ohmic contacts degrade due to alloy sintering. On the other hand, for a compound semiconductor device having an active layer formed of III–V semiconductor materials, the V-group components of III–V materials (for example, As in GaAs) may dissolve due to high temperature processing, leading to unreliable material characteristics as well as device failures.

With the improvement in fabrication techniques, a novel silicon oxide growing method known as plasma-enhanced chemical vapor phase deposition (PECVD) has been developed and successfully demonstrated in the temperature range from 300 to 400° C. However, it is notable that such a temperature range for silicon oxide growth by using plasma is still too high for deep sub-micron fabrication process, which may lead to device damage during PECVD operation.

Accordingly, various new deposition techniques have been developed. Particularly, low-temperature liquid-phase deposition has attracted considerable attention for its advantages such as low cost and high throughput. In the prior art, a wet trough for low-temperature deposition has a serious problem in that the contaminative particles generated in the wet trough make the control difficult for temperature, on-line monitoring system, solution supply, and cleaning, which may cause trouble in on-line mass production techniques. On the other hand, the prior art has another problem in that the deposition apparatus suffers from poor reliability resulted from the jam in the loop.

Accordingly, there is need in providing a method for low temperature liquid-phase deposition for forming a low-temperature grown film or a film with excellent step-coverage used as a passivation layer on a semiconductor device or as an insulating layer between interconnection metal layers for ICs. The present further provides a method for cleaning a liquid-phase deposition apparatus.

SUMMARY OF THE INVENTION

In view of the aforementioned issue, it is the primary object of the present invention to provide a method for low temperature liquid-phase deposition for forming a low-temperature grown film or a film with excellent step-coverage used as a passivation layer on a semiconductor device having independent circuit functions or as an insulating layer between interconnection metal layers for ICs.

It is another object of the present invention to provide a method for cleaning a liquid-phase deposition apparatus, in which real-time monitor of the pH value variation is employed with auto-titration such that the reaction rate is stably controlled in surface reaction region instead of mass transfer process to effectively overcome self-contamination.

In order to achieve the above objects, the present invention provides a method for low temperature liquid-phase deposition, comprising steps of: adding a solute to an $H_2SiF_6$ solution, making the solution a saturated $H_2SiF_6$ solution; preparing a sample on which a thin film is to be deposited, wherein at least a semiconductor device having independent circuit functions has been fabricated on a surface of the sample; and adding a reactant to the saturated $H_2SiF_6$ solution, making the saturated $H_2SiF_6$ solution an over-saturated $H_2SiF_6$ solution so as to form a thin film by liquid-phase deposition on the sample.

The present invention further provides a method for cleaning a liquid-phase deposition apparatus characterized in that a loop used exclusively for cleaning is employed so as to prevent $SiO_2$ powders from remaining in the loop, comprising steps of, periodically cleaning the apparatus as well as the loop by using a solution added with $SiO_2$; repeating placing the solution and bi-directional circulation; and exhausting the solution into a storage trough for recycling purposes.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE INVENTION

The present invention providing a method for low temperature liquid-phase deposition and a method for cleaning a liquid-phase deposition apparatus can be exemplified by the preferred embodiment as described hereinafter.

Figure 1:
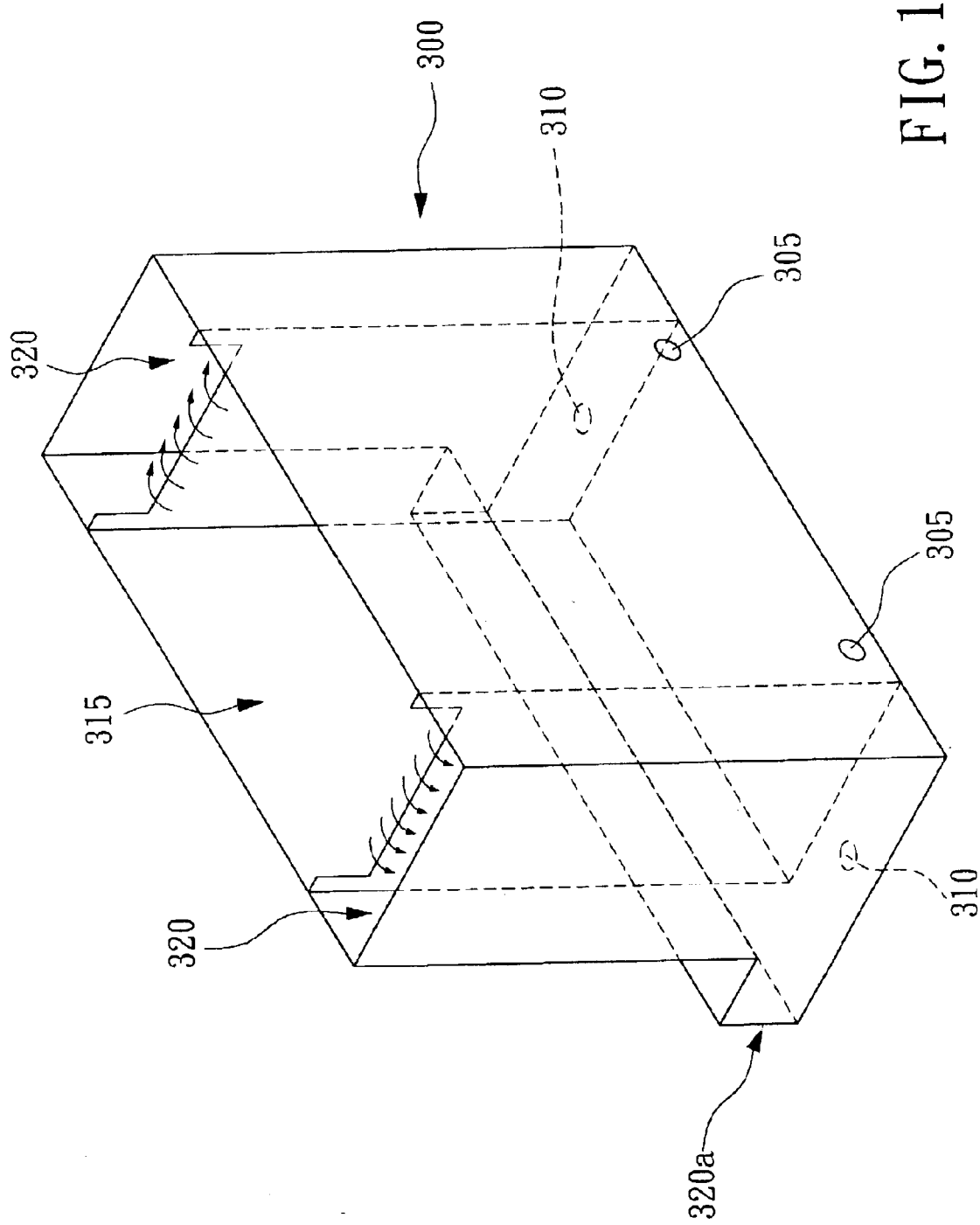
FIG. 1 is a schematic diagram showing an over-saturation reaction trough and two liquid level control troughs of a steady-flow over-saturation loop reaction system allowing over-flow on two opposite sides in accordance with the preferred embodiment of the present invention.

Please refer to FIG. 1, which shows a schematic diagram showing an over-saturation reaction trough 315 and two liquid level control troughs 320 in a reaction trough 300 of a steady-flow over-saturation loop reaction system in accordance with the preferred embodiment of the present invention. It is designed to allow over-flow on two opposite sides. The reaction trough 300 includes an over-saturation reaction trough 315 and two liquid level control troughs 320. On the bottom of the over-saturation reaction trough 315 there are disposed two liquid entries 305 for the supply 320 there is disposed a liquid exit 310 for the exhaust of reactants. It is notable that on the bottom of the two liquid level control troughs 320 there is a Π-shaped channel or a connection tube to interconnect the two liquid level control troughs 320 and balance the liquid heights of the two liquid level control troughs 320. Similarly, the reactants enter the over-saturation reaction trough 315 via the liquid entries 305. When the liquid level exceeds the height of the over-saturation reaction trough 315, the reactants over-flow into the liquid level control troughs 320 on both sides and then exhaust via the liquid exits 310. Such is a design for two-sided over-flow.

Figure 2:
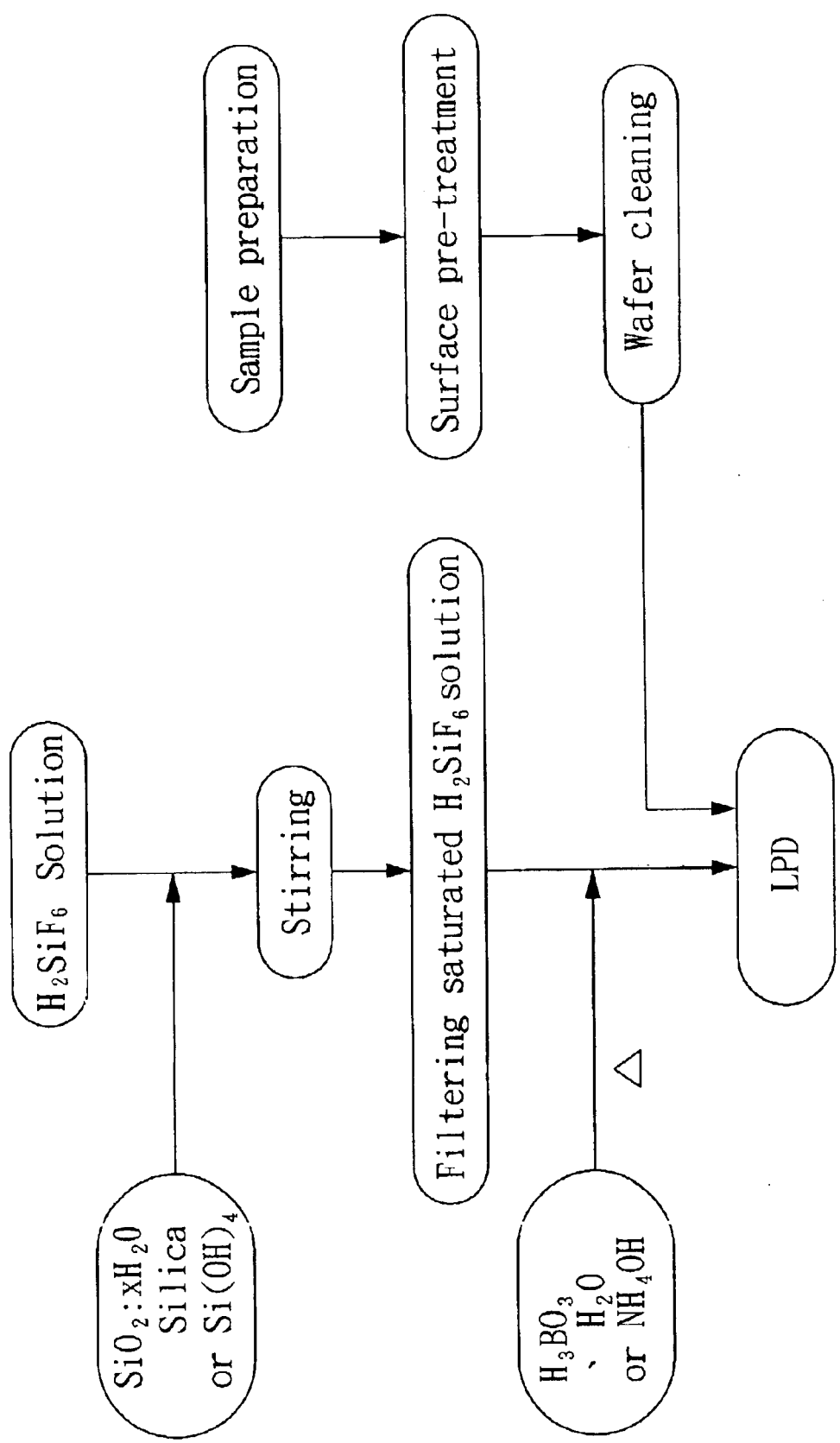
FIG. 2 is a flow chart showing a method for low temperature liquid-phase deposition in accordance with the preferred embodiment of the present invention.

With the apparatus introduced above, the present invention provides a method for low temperature liquid-phase deposition as shown in the flow chart in FIG. 2. The method comprises steps of:

Step 1: adding a solute to an $H_2SiF_6$ solution, making the solution a saturated $H_2SiF_6$ solution. The $H_2SiF_6$ solution with the solute is stirred and then filtered. In the present embodiment, the solute contains one selected from a group of $Si(OH)_4$, $SiO_2$ and silicate. The reaction mechanism is expressed as:

$$5H_2SiF_6 + SiO_2 \rightarrow 3[SiF_6-SiF_4]^{2-} + 2H_2O + 6H^+$$

$$[SiF_6-SiF_4]^{2-} + 2H_2O \rightarrow SiF_4(OH)_2^{2-} + SiF_4 + 2HF$$

$$SiF_4(OH)_2^{2-} + 2H^+ \rightarrow SiF_4 + 2H_2O$$

$$3SiF_4 + 4H_2O \rightarrow 2SiF_6^{2-} + Si(OH)_4 + 4H^+$$

In the reaction, $Si(OH)_4$ participates the reaction resulting in $SiO_2$; therefore, it is necessary to increase the concentration of $Si(OH)_4$. In order to increase the concentration of $Si(OH)_4$, $SiF_4$ and $H_2O$ have to be increased. Therefore, we employ $SiO_2$ to be solved in HF solution, generating $SiF_4$ at room temperature.

Step 2: preparing a sample on which a thin film is to be deposited, wherein at least a semiconductor device having independent circuit functions has been fabricated on a surface of the sample. More particular, Step 2 comprises steps of: surface pre-treatment by using an oxidant, forming OH radicals on the sample surface; and cleaning the sample by using acetone, methanol and de-ionized water in turn. In the present embodiment, the oxidant contains one component selected from a group of $NH_4OH$, $H_2O_2$ and ozone ($O_4$).

There does not exist good adhesion between GaAs and $SiO_2$; therefore, sample pretreatment is critically important so as to enhance adhesion. OH radicals are required when it comes to growing $SiO_2$ by dehydrogenatinig $Si(OH)_4$. The adhesion between GaAs and $SiO_2$ is so poor that a $GaO_x$ layer is required because there is better adhesion between $GaO_x$ with OH radicals and there is no dislocation between $GaO_x$, and $SiO_2$. Accordingly, GaAs is oxidized to form a $GaO_x$l layer to provide active sites for $SiO_2$ deposition. In the present embodiment, an acid solution such as $HNO_3$ or $H_2O_2$ is used to oxidize the GaAs surface to form $GaO_x$. $GaO_x$ then absorbs a great number of OH radicals so as to enhance $SiO_2$ growth on GaAs.

Step 3: adding a reactant to the saturated $H_2SiF_6$ Solution, making the saturated $H_2SiF_6$ solution an over-saturated $H_2SiF_6$ solution so as to form a thin film by liquid-phase deposition on the sample. The reaction mechanism is expressed as:

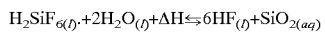

More particularly, $HBO_3$ or de-ionized $H_2O$ is added such that the solution becomes over-saturated. The over-saturated solution is placed and deposition is performed at room temperature or in the 40~50° C. range. Or rather, $SiO_2$ is dissolved in an HF solution and then $SiF_4$ is generated. $SiF_4$ is then added to the saturated $H_2SiF_6$ solution such that the concentration of is $SiF_4$ increased, which helps the growth of $SiO_2$.

To further control the reaction rate during liquid-phase deposition, the method further comprise a step of:

Step 4: adjusting the concentration of the over-saturated $H_2SiF_6$ solution according to a pH-value measured by a pH meter. In Step 4, micro-particles are removed from the over-saturated $H_2SiF_6$ solution by filtering. The concentration of $SiF_4$ in the over-saturated $H_2SiF_6$ solution is reduced by one approach selected from temperature increase and pressure reduction so as to the concentration of reactive ions. Furthermore, the reactant is added to the over-saturated $H_2SiF_6$ according to the ph-value measured by the pH meter. In the present embodiment, the reactant contains one component selected from a group of $H_2O$, $HBO_3$ and $H_2SiF_6$ solution added with $SiO_2$.

Figure 3A:
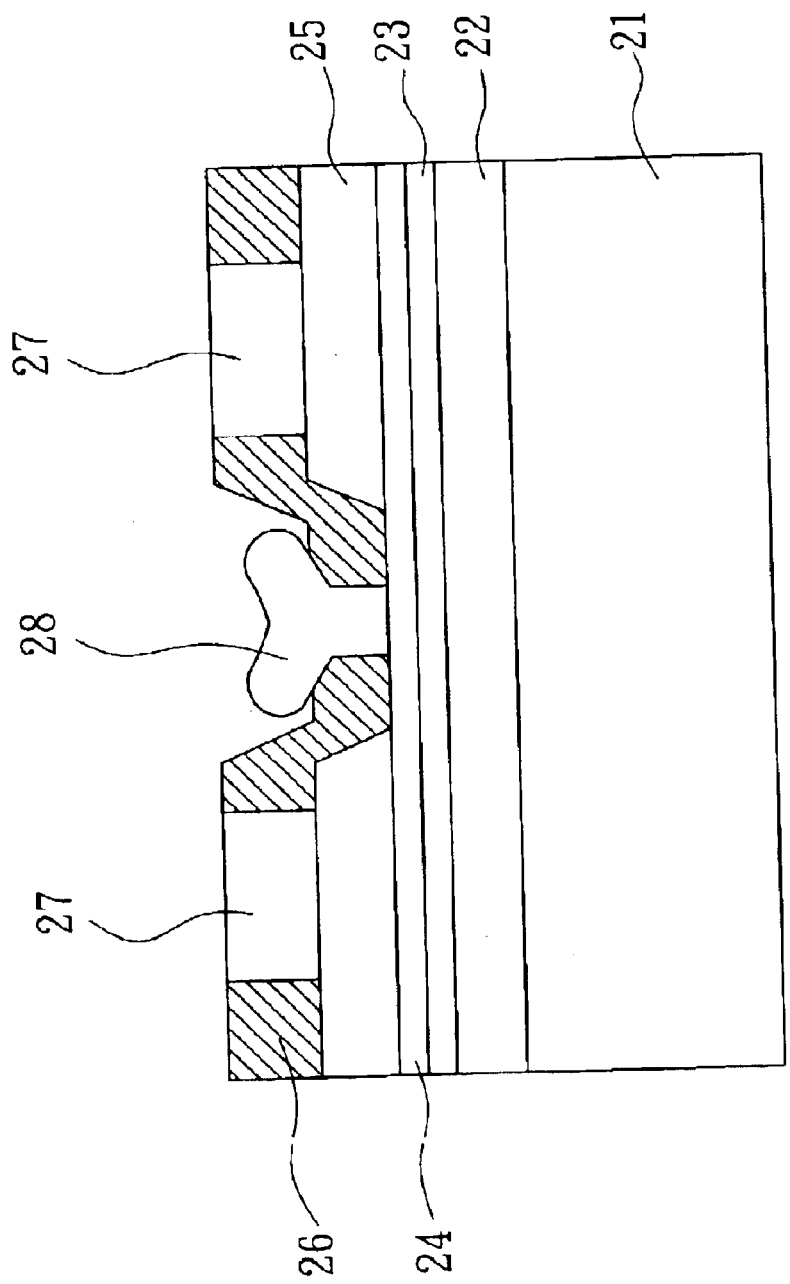
FIG. 3A and FIG. 3B are schematic cross-sectional views showing examples of passivated GaAs-based field-effect transistors in accordance with the preferred embodiment of the present invention.
Figure 3B:
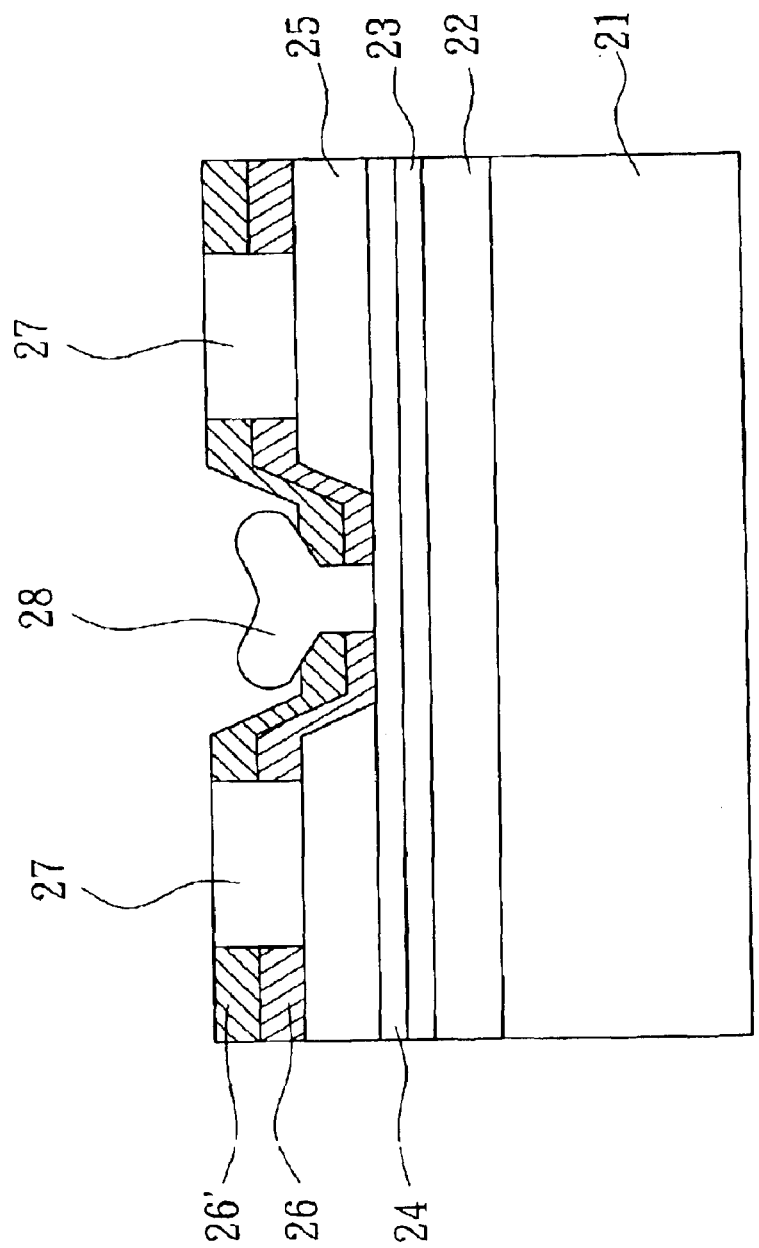

The thin film grown by the method mentioned above can be used as a first passivation layer on a semiconductor device having independent circuit functions or a film with excellent step-coverage used as an insulating layer between interconnection metal layers for ICs. Please refer to FIG. 3A and FIG. 3B, which are schematic cross-sectional views showing examples of passivated GaAs-based field-effect transistors (FETs) in accordance with the preferred embodiment of the present invention. In both FIG. 3A and FIG. 3B, the FET has an epitaxial structure comprising, from the substrate up: a substrate 21, a buffer layer 22, a channel layer 23, a barrier layer 24, and an ohmic contact layer 25. After conventional semiconductor processing techniques such as photolithography, etching and evaporation are used to form a semiconductor device, with electrodes for the drain/source 27 and the gate 28, having independent circuit functions, a passivation layer is formed on the active region of the GaAs-based semiconductor device so as to protect the device from contaminants such as moisture, oxygen or micro-particles. FIG. 3A shows an example of the FET having a single passivation layer 26 formed of silicon oxide or silicon nitrogen oxide. However in FIG. 3B, the FET has a dual passivation layer, comprising a first passivation layer 26 formed of $SiO_2$ by low-temperature liquid-phase deposition and a second passivation layer 26' formed of $SiO_2$ by low-temperature liquid-phase deposition or $Si_3N_4$ by conventional plasma-enhanced chemical vapor deposition (PECVD). Please note that $Si_3N_4$ has better water resistance than $SiO_2$.

Figure 4:
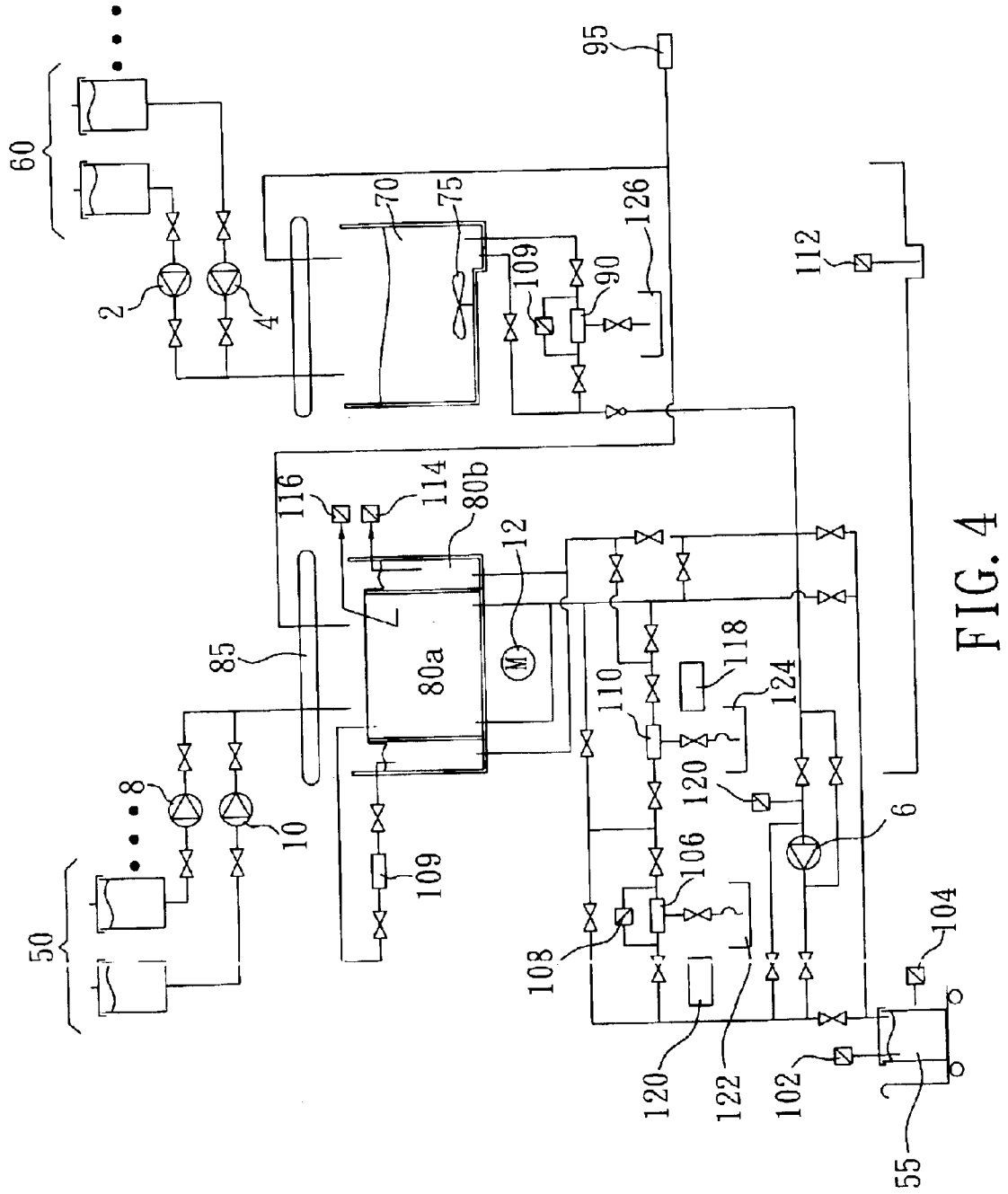
FIG. 4 is a schematic diagram showing an apparatus for a method for cleaning an LPD apparatus in accordance with the preferred embodiment of the present invention.

Furthermore, please refer to FIG. 4, which a schematic diagram showing an apparatus for a method for cleaning an LPD apparatus in accordance with the preferred embodiment of the present invention. This apparatus comprises a saturation reaction system, a steady-flow over-saturation loop reaction system, an automatic solution concentration monitoring system, and a waste liquid recycling system. The saturation reaction system comprises a mixture trough 70, at least two supply devices 60 for raw materials, a stirrer device 75, a filter device 90, and valve control devices such as pumps 2, 4. The steady-flow over-saturation loop reaction system includes an over-saturation reaction trough 80a, at least one liquid level control trough 80b, at least two supply devices 50 for raw materials, a stirrer device, a filter device, and valve control devices. The filter device is composed of a pump 6, a filter 106, a filter jamming sensor 108, a heater 110, an over-heating sensor 118, and a pump protection sensor 120. The automatic solution concentration monitoring system 109 is used to control the reactant concentrations. The waste liquid recycling system comprises at least two storage troughs 55 for storing the recycled waste liquids, a recycled waste liquid level sensor 102 for detecting the liquid level of the recycled waste liquids, a recycled waste liquid sensor 104, and valve control devices.

The present invention further provides a method for cleaning a liquid-phase deposition apparatus characterized in that a loop used exclusively for cleaning is employed so as to prevent $SiO_2$ powders from remaining in the loop, comprising steps of:

Step 1: periodically cleaning the apparatus as well as the loop by using a solution added with $SiO_2$. More particularly, an over-saturated solution from a steady-flow over-saturation loop reaction system is exhausted into a storage trough 55 and a filter 90 is removed for one selected from renew and cleaning. A certain amount of $SiO_2$ is added to a saturation reaction system from a raw material supply device 60. The saturation reaction system is stirred such that $SiO_2$ can dissolved in the saturation reaction system. Then a pump 6 is turned on to deliver the solution to the steady-flow over-saturation loop reaction system.

Step 2: repeating placing the solution and bi-directional circulation.

More particularly, the solution is placed in the steady-flow over-saturation loop reaction system for a period of time. Then, the pump 6 is turned on to clean the loop and the apparatus and a reverse loop for bi-directional circulation is installed so as to speed up dissolution of $SiO_2$ deposit on the filter 106. The steps b1 and b2 are repeated so as to remove the deposit. A heater 110 is employed to cool down the temperature such that the deposit dissolves. Moreover; the filter is placed bottom up such that the deposit in the step b falls down near an output terminal of the loop and is quickly swept away.

Step 3: exhausting the solution into a storage trough 55 for recycling purposes.

Moreover, the aforementioned steps are repeated for a couple of times so as to enhance the cleaning.

According to the above discussion, the present invention discloses a method for low temperature liquid-phase deposition for forming a low-temperature grown film or a film with excellent step-coverage used as a passivation layer on a semiconductor device having independent circuit functions or as an insulating layer between interconnection metal layers for ICs. Therefore, the present invention has been examined to be novel, unobvious and useful.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for low temperature liquid-phase deposition, comprising steps of:

a) adding a solute to an $H_2SiF_6$ solution, making said solution a saturated $H_2SiF_6$ solution;

b) preparing a sample on which a thin film is to be deposited, wherein at least a semiconductor device having independent circuit functions has been fabricated on a surface of said sample;

c) adding a reactant to said saturated $H_2SiF_6$ solution, making said saturated $H_2SiF_6$ solution an over-saturated $H_2SiF_6$ solution so as to form a thin film by liquid-phase deposition on said sample: and d) adjusting the concentration of said over-saturated $H_2SiF_6$ solution according to a pH-value measured by a pH meter, the adjusting step d) including:

d1) removing micro-particles from said over-saturated $H_2SiF_6$ solution by filtering:

d2) reducing the concentration of SiF4 in said over-saturated $H_2SiF_6$ solution by one approach selected from temperature increase and pressure reduction so as to the concentration of reactive ions: and d3) adding said reactant to said over-saturated $H_2SiF_6$ according to said pH-value measured by said pH meter.

2. The method as recited in claim 1, wherein said step a comprises:

a1) stirring said $H_2SiF_6$ solution; and a2) filtering said saturated $H_2SiF_6$ solution.

3. The method as recited in claim 2, wherein said solute contains one component selected from a group of $Si(OH)_4$, $SiO_2$ and silicate.

4. The method as recited in claim 1, wherein said step b comprises:

b1) surface pre-treatment by using an oxidant, forming OH radicals on said sample surface; and b2) cleaning said sample by using acetone, methanol and de-ionized water in turn.

5. The method as recited in claim 4, wherein said oxidant contains one component selected from a group of $HN_4OH$, $H_2O_2$ and ozone ($O_3$).

6. The method as recited in claim 1, wherein said reactant contains one component selected from a group of $H_2O$, $HBO_3$ and $H_2SiF_6$ solution added with $SiO_2$.

* * * * *